United States Patent
Cai et al.

(10) Patent No.: US 9,153,659 B2
(45) Date of Patent: Oct. 6, 2015

(54) GATE ROUNDING FOR REDUCED TRANSISTOR LEAKAGE CURRENT

(75) Inventors: Yanfei Cai, Shanghai (CN); Ji Li, Shanghai (CN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/365,007

(22) PCT Filed: Dec. 14, 2011

(86) PCT No.: PCT/CN2011/083934
§ 371 (c)(1),
(2), (4) Date: Jun. 12, 2014

(87) PCT Pub. No.: WO2013/086693
PCT Pub. Date: Jun. 20, 2013

(65) Prior Publication Data
US 2014/0346606 A1    Nov. 27, 2014

(51) Int. Cl.
*H01L 29/423* (2006.01)
*H01L 29/78* (2006.01)
*H01L 21/28* (2006.01)
*H01L 27/088* (2006.01)
*H01L 29/49* (2006.01)

(52) U.S. Cl.
CPC ...... *H01L 29/4238* (2013.01); *H01L 21/28008* (2013.01); *H01L 27/088* (2013.01); *H01L 29/4916* (2013.01); *H01L 29/78* (2013.01)

(58) Field of Classification Search
None
See application file for complete search history.

(56) References Cited

U.S. PATENT DOCUMENTS

| | | | |
|---|---|---|---|
| 5,742,086 A * | 4/1998 | Rostoker et al. | 257/300 |
| 5,874,754 A | 2/1999 | Lee et al. | |
| 5,973,376 A * | 10/1999 | Rostoker et al. | 257/401 |
| 6,876,042 B1 * | 4/2005 | Yu et al. | 257/365 |
| 6,905,921 B1 * | 6/2005 | Liu et al. | 438/197 |
| 7,008,832 B1 * | 3/2006 | Subramanian et al. | 438/182 |

(Continued)

FOREIGN PATENT DOCUMENTS

| | | |
|---|---|---|
| CN | 1516287 | 7/2004 |
| JP | 2006156778 | 6/2006 |

(Continued)

OTHER PUBLICATIONS

"PCT Application No. PCT/CN2011/083934 International Search Report and Written Opinion", Oct. 18, 2012, 12 pages.

(Continued)

*Primary Examiner* — Thao P Le
(74) *Attorney, Agent, or Firm* — DeLizio Law, PLLC

(57) ABSTRACT

Gate-rounding fabrication techniques can be implemented to increase an effective channel length of a transistor and to consequently reduce the leakage current and static power consumption associated with the transistor. The transistor comprises a substrate region that includes a source region and a drain region. The transistor can also comprise a gate region that includes a main gate portion, one or more gate tips, and one or more corresponding gate-rounded portions. Each of the one or more gate tips is formed at a suitable position along the side of the main gate portion. During fabrication, the junction between the main gate region and each of the gate tips takes on a rounded shape to form a corresponding gate-rounded region. The gate-rounded regions increase the average length of the gate region and the effective channel length of the transistor.

20 Claims, 5 Drawing Sheets

(56) References Cited

U.S. PATENT DOCUMENTS

| | | | |
|---|---|---|---|
| 7,595,523 B2* | 9/2009 | Parthasarathy et al. | 257/302 |
| 2002/0130354 A1 | 9/2002 | Sekigawa et al. | |
| 2006/0097294 A1 | 5/2006 | Yamashita et al. | |
| 2006/0113533 A1 | 6/2006 | Tamaki et al. | |
| 2007/0096158 A1 | 5/2007 | Komaki | |
| 2010/0044780 A1 | 2/2010 | Riviere-cazaux et al. | |
| 2011/0180850 A1* | 7/2011 | Shih et al. | 257/192 |
| 2012/0267609 A1* | 10/2012 | Liang et al. | 257/39 |

FOREIGN PATENT DOCUMENTS

| | | |
|---|---|---|
| JP | 2007121867 | 5/2007 |
| JP | 2011129550 | 6/2011 |
| JP | 2012500496 | 1/2012 |
| JP | 2015502712 | 1/2015 |
| WO | 2010021785 | 2/2010 |
| WO | 2013086693 | 6/2013 |

OTHER PUBLICATIONS

EP Application No. 11877284.7 Communication pursuant to Rule 164(1) EPC & Partial Search Report, Mar. 19, 2015, 7 pages.

"EP Application No. 11877284.7 Extended European Search Report", Jul. 3, 2015, 13 pages.

"Japanese Patent Application No. 2014-546267, Office Action", Apr. 28, 2015, 15 pages.

* cited by examiner

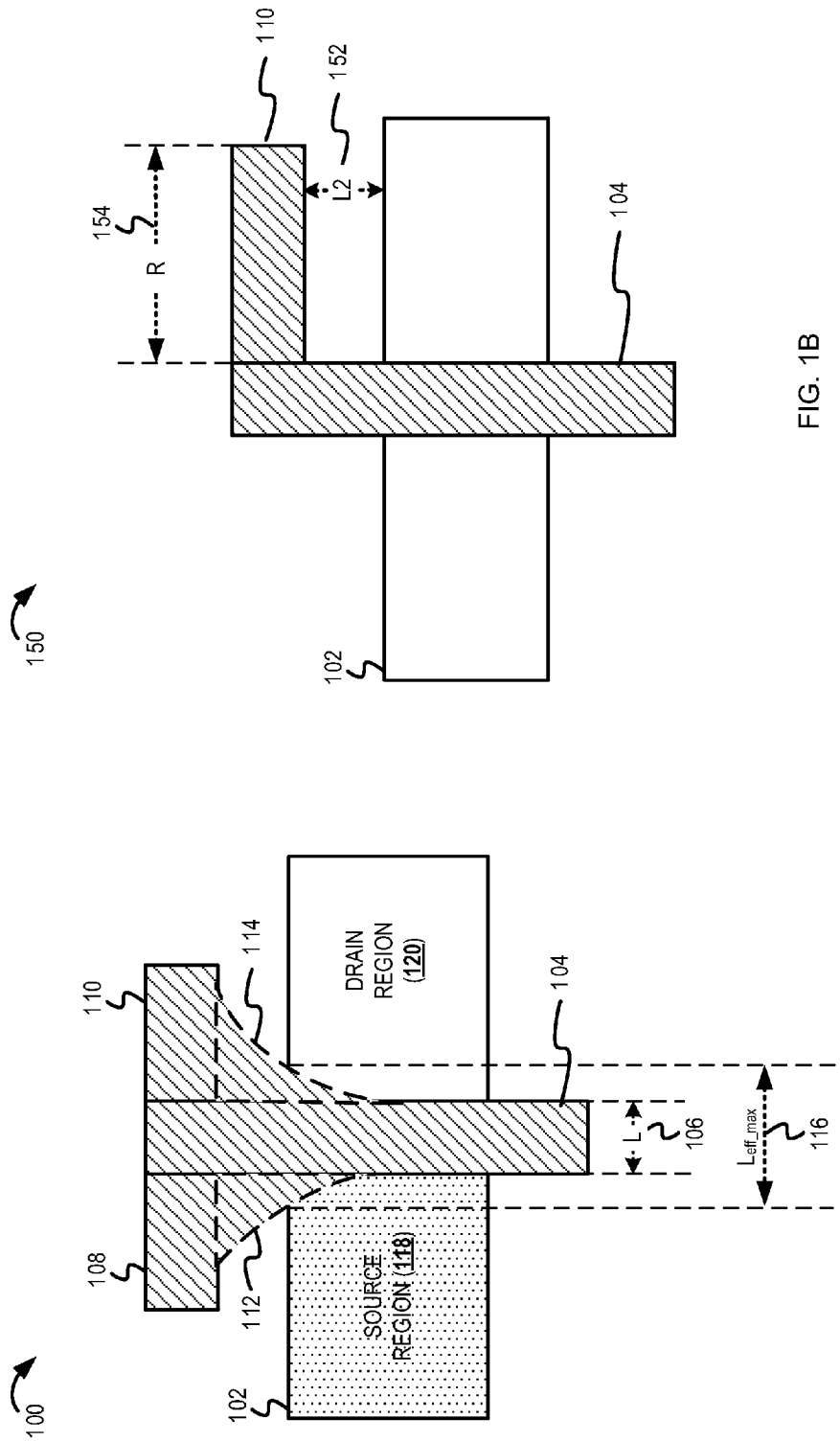

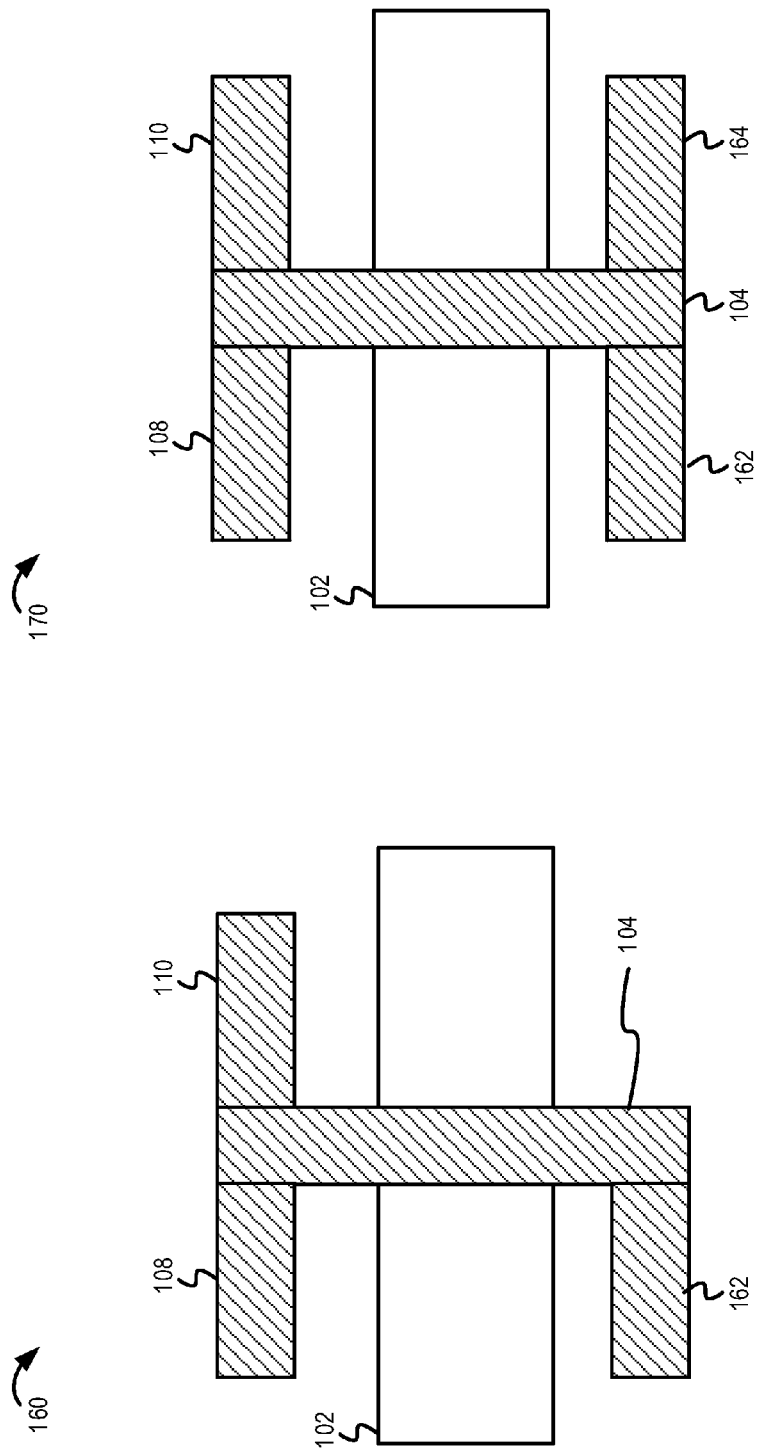

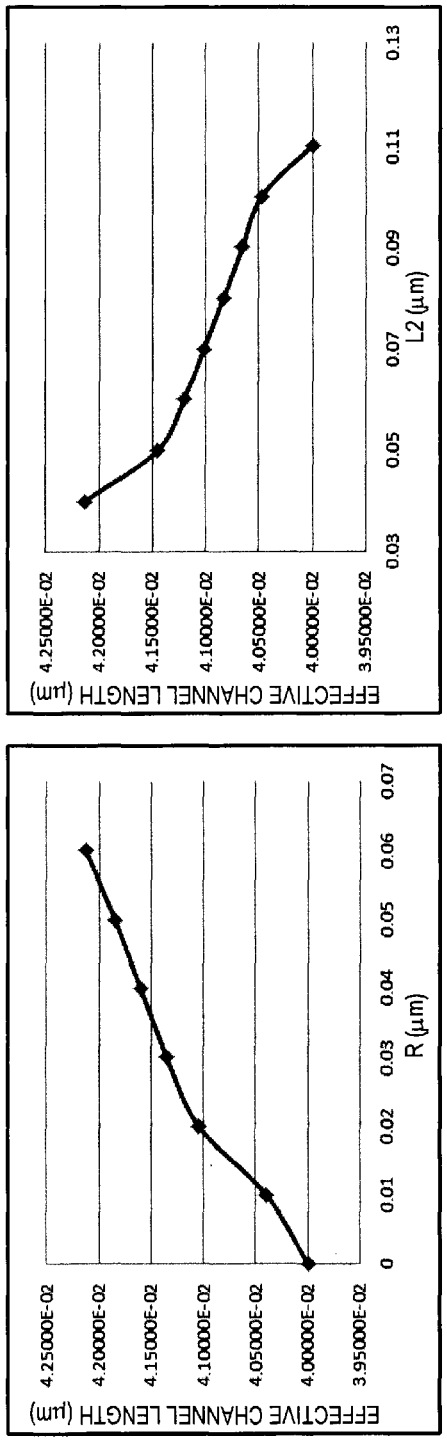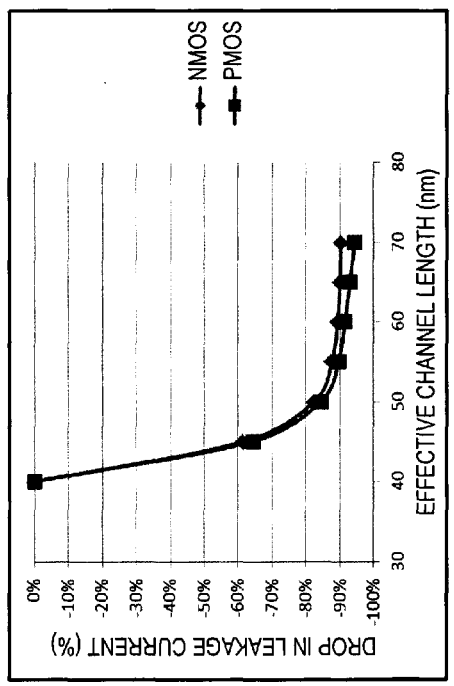
FIG. 2A
FIG. 2B
FIG. 2C

GATE ROUNDING FOR REDUCED TRANSISTOR LEAKAGE CURRENT

BACKGROUND

Embodiments of the inventive subject matter generally relate to the field of semiconductor fabrication and, more particularly, to gate rounding for reduced transistor leakage current.

Metal oxide semiconductor field effect transistors (MOSFETs) are typically associated with a leakage current. Ideally, the MOSFET does not conduct current when the MOSFET is biased in an OFF state (e.g., when a bias voltage is not applied between a gate terminal and a source terminal of the MOSFET). However, practically, the MOSFET generates a leakage current because of reverse-bias leakage between the MOSFET's source region and drain region via the substrate (on which the source region and the drain region are implemented). The leakage current can cause the MOSFET to dissipate power ("static power"). In some instances, static power consumption can account for 30% of the total power consumption of an integrated circuit that comprises the MOSFETs. Static power consumption can generate unwanted heat and can drain the power (especially in battery-powered portable electronic devices).

SUMMARY

In some embodiments, a transistor comprises a substrate region that includes a source region and a drain region. The transistor also comprises a gate region that includes a main gate portion, one or more gate tips, and one or more corresponding gate-rounded portions. Each of the one or more gate tips is formed at one end of the main gate portion. For each of the one or more gate tips, a corresponding gate-rounded portion is formed at a junction between the gate tip and the main gate portion.

In some embodiments, the gate region is a polysilicon gate region comprising a polysilicon main gate portion, one or more polysilicon gate tips, and one or more corresponding polysilicon gate-rounded portions.

In some embodiments, the main gate portion comprises a first end and a second end. Each of the one or more gate tips is formed at one of the ends of the main gate portion, and each of the one or more gate tips has substantially a predetermined length and is formed at substantially a predetermined distance from the substrate region.

In some embodiments, the predetermined length and the predetermined distance are determined based on at least one of: a gate region fabrication process, a geometric design layout of an integrated circuit that comprises the transistor, a minimum feature size associated with the transistor, and one or more design rules associated with the integrated circuit.

In some embodiments, the main gate portion comprises a first end and a second end. Each of the one or more gate tips is formed at one of the ends of the main gate portion, and each of the one or more gate tips is substantially parallel to the substrate region.

In some embodiments, the main gate portion comprises a part of the main gate portion that is formed above the substrate region, a first end, and a second end. The first and second ends are formed substantially perpendicular to the substrate region, and the one or more gate tips are formed at one of the ends and are substantially parallel to the substrate region. The gate region is formed on a gate oxide portion that is formed on the substrate region.

In some embodiments, the transistor further comprises a gate oxide portion formed between the substrate region and the gate region.

In some embodiments, the main gate portion comprises a first end and a second end. The one or more gate tips comprise a first gate tip, and the first gate tip is formed at the first end of the main gate portion.

In some embodiments, the main gate portion comprises a first end and a second end, and the one or more gate tips comprise a first gate tip and a second gate tip. The first gate tip and the second gate tip are formed at the first end of the main gate portion, or the first gate tip is formed at the first end of the main gate portion and the second gate tip is formed at the second end of the main gate portion.

In some embodiments, the main gate portion comprises a first end and a second end, and the one or more gate tips comprise a first gate tip, a second gate tip, and a third gate tip. The first gate tip and the second gate tip are formed at the first end of the main gate portion and the third gate tip is formed at the second end of the main gate portion.

In some embodiments, the main gate portion comprises a first end and a second end, and the one or more gate tips comprise a first gate tip, a second gate tip, a third gate tip, and a fourth gate tip. The first gate tip and the second gate tip are formed at the first end of the main gate portion and the third gate tip and the fourth gate tip are formed at the second end of the main gate portion.

In some embodiments, for each of the one or more gate tips, the gate-rounded region between the gate tip and the main gate portion extends across a portion of the substrate region increasing an effective channel length associated with the transistor.

In some embodiments, the effective channel length associated with the transistor is an average gate length associated with the transistor. The average gate length is calculated based, at least in part, on a first gate length associated with a first portion of the substrate region that is covered by the one or more gate-rounded portions and a second gate length associated with a second portion of the substrate region that is not covered by the one or more gate-rounded portions.

In some embodiments, for each of the one or more gate tips, an increase in a length of the gate tip increases an effective channel length associated with the transistor, and a decrease in a distance between the gate tip and the substrate region increases the effective channel length associated with the transistor.

In some embodiments, the transistor is a metal oxide semiconductor field effect transistor (MOSFET).

In some embodiments, a metal oxide semiconductor field effect transistor (MOSFET) comprises a substrate region includes a source region and a drain region; and a gate region includes a main gate portion, one or more gate tips, and one or more corresponding gate-rounded portions. The main gate portion comprises a first end and a second end. Each of the one or more gate tips is formed at one of the ends of the main gate portion, and each of the one or more gate tips has substantially a predetermined length and is formed substantially at a predetermined distance from the substrate region. For each of the one or more gate tips, a corresponding gate-rounded portion is formed at a junction between the gate tip and the main gate portion.

In some embodiments, each of the one or more gate tips are formed within corresponding one or more voids between components in a design layout of an integrated circuit that comprises the MOSFET.

In some embodiments, the length of each of the one or more gate tips is determined based, at least in part, on a length of the void within which the gate tip is formed.

In some embodiments, each of the one or more gate tips is associated with a different length and a different distance to the substrate region.

In some embodiments, the main gate portion comprises a first end and a second end. The one or more gate tips comprises a first gate tip, and wherein the first gate tip is formed at one of the ends of the main gate portion; the one or more gate tips comprise a first gate tip and a second gate tip, and wherein the first gate tip is formed at the first end of the main gate portion and the second gate tip is formed at the second end of the main gate portion; the one or more gate tips comprise a first gate tip, a second gate tip, and a third gate tip, and wherein the first gate tip and the second gate tip are formed at the first end of the main gate portion and the third gate tip is formed at the second end of the main gate portion; or the one or more gate tips comprise a first gate tip, a second gate tip, a third gate tip, and a fourth gate tip, and wherein the first gate tip and the second gate tip are formed at the first end of the main gate portion and the third gate tip and the fourth gate tip are formed at the second end of the main gate portion.

In some embodiments, an integrated circuit comprises a plurality of transistors, each of the plurality of transistor comprises: a substrate region including a source region and a drain region; and a gate region including a main gate portion, one or more gate tips, and one or more corresponding gate-rounded portions. Each of the one or more gate tips is formed at an end of the main gate portion, and for each of the one or more gate tips, a corresponding gate-rounded portion is formed at a junction between the gate tip and the main gate portion.

In some embodiments, for each of the plurality of transistors, the main gate portion of the transistor comprises a first end and a second end. Each of the one or more gate tips is formed at one of the ends of the main gate portion, and each of the one or more gate tips has substantially a predetermined length and is formed at substantially a predetermined distance from the substrate region.

In some embodiments, for each of the plurality of transistors, each of the one or more gate tips is formed within corresponding one or more voids between components in a design layout of the integrated circuit.

In some embodiments, for each of the plurality of transistors, the length of each of the one or more gate tips is determined based, at least in part, on a length of the void within which the gate tip is formed.

In some embodiments, a method comprises: forming a gate oxide layer on a substrate region of a transistor of an integrated circuit, wherein the substrate region comprises a source region and a drain region; depositing a gate material on the gate oxide layer of the transistor; and removing a portion of the gate material and the corresponding gate oxide layer from the substrate region of the transistor to form a gate region of the transistor. The gate region comprises a main gate portion, one or more gate tips, and one or more corresponding gate-rounded portions. Each of the one or more gate tips is formed at an end of the main gate portion, and each of the one or more gate tips has substantially a predetermined length and is formed substantially at a predetermined distance from the substrate region. For each of the one or more gate tips, a corresponding gate-rounded portion is formed at a junction between the gate tip and the main gate portion.

In some embodiments, said removing the portion of the gate material and the corresponding gate oxide layer from the substrate region of the transistor to form a gate region of the transistor comprises applying a gate fabrication mask to remove the portion of the gate material and the corresponding gate oxide layer from the substrate region of the transistor and to form the gate region of the transistor including the main gate portion, the one or more gate tips, and the one or more corresponding gate-rounded portions.

In some embodiments, each of the one or more gate tips is formed within a corresponding void between the main gate portion and one or more components of the integrated circuit.

In some embodiments, for each of the one or more gate tips, the length of the gate tip is determined based, at least in part, on a length of the void within which the gate tip is formed.

In some embodiments, an increase in the length of the gate tip increases an effective channel length associated with the transistor, and a decrease in the distance between the gate tip and the substrate region increases the effective channel length associated with the transistor.

BRIEF DESCRIPTION OF THE DRAWINGS

The present embodiments may be better understood, and numerous objects, features, and advantages made apparent to those skilled in the art by referencing the accompanying drawings.

FIG. 1A is an example conceptual diagram of a MOSFET that employs the gate-rounding process to minimize leakage current generated by the MOSFET;

FIG. 1B is an example conceptual diagram of a MOSFET including gate-rounding parameters that influence effective channel length of the MOSFET;

FIG. 1C is an example conceptual diagram of a MOSFET comprising three gate tips;

FIG. 1D is an example conceptual diagram of a MOSFET comprising four gate tips;

FIG. 2A is an example graph illustrating the relationship between the effective channel length associated with the MOSFET and the length of the gate tip;

FIG. 2B is an example graph illustrating the relationship between the effective channel length associated with the MOSFET and the distance between the gate tip and the substrate region;

FIG. 2C is an example graph illustrating the relationship between the effective channel length associated with the MOSFET and the leakage current generated by the MOSFET;

DESCRIPTION OF EMBODIMENT(S)

Figure 3:
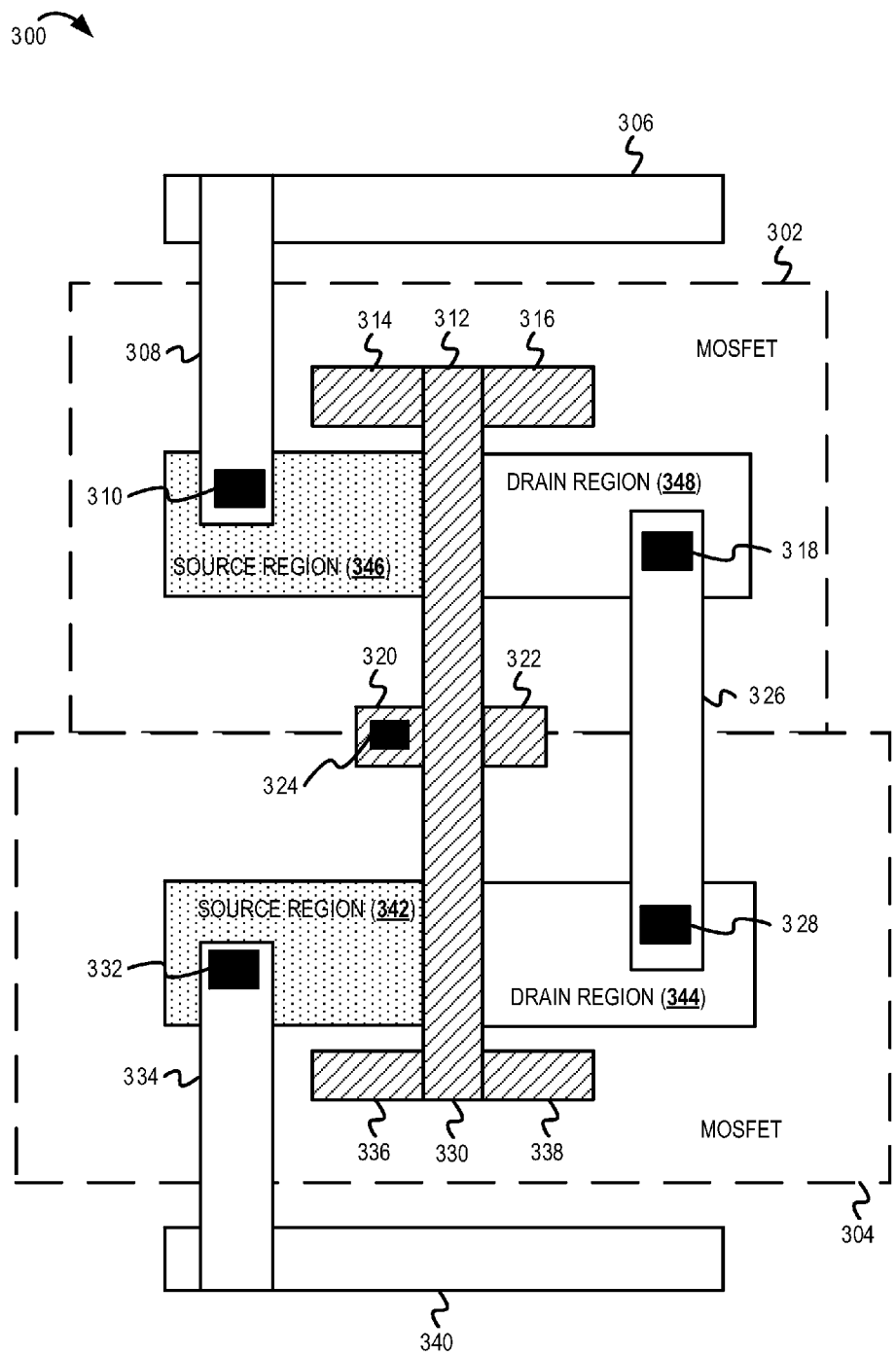
FIG. 3 is an example inverter layout using MOSFETs fabricated using the gate-rounding process.

The description that follows includes exemplary systems, methods, techniques, structures, and circuit elements that embody techniques of the present inventive subject matter. However, it is understood that the described embodiments may be practiced without these specific details. For instance, although examples refer to a poly-silicon material being employed to fabricate the gate region of the MOSFETs, in other embodiments other suitable materials (e.g., metals) can be employed to fabricate the gate region of the MOSFETs. Although examples describe gate-rounding techniques for reducing leakage power in the MOSFETs, in other embodiments the gate-rounding techniques can be applied to reduce leakage current in other suitable transistors (e.g., junction field effect transistors (JFET), etc.). In other instances, well-known structures and techniques have not been shown in detail in order not to obfuscate the description.

Static power consumption, caused by leakage current in a MOSFET, can result in unnecessary wastage of power supplied to an integrated circuit (that comprises the MOSFET). Additionally, the leakage current generated by the MOSFET increases as the size of the MOSFET decreases. This, in turn, can cause the static power consumption of the MOSFET and the integrated circuit to increase. Some existing techniques for reducing the leakage current generated by the MOSFET and reducing the static power consumption include a high-threshold MOSFET design or a long-channel MOSFET design. The high-threshold MOSFET design can utilize high-threshold MOSFETs, which require one or more additional masks for fabrication. Consequently, implementing the high-threshold MOSFET design can increase the cost of MOSFET design and fabrication. The long-channel MOSFET design attempts to increase the channel length (i.e., increase the distance between a source region and a drain region of the MOSFET) by increasing the length of the gate region. However, to accommodate the increase in the gate region (and the channel length), the long-channel MOSFET design may require a larger area, which may increase the cost and utilize too much die area in integrated circuits.

A gate-rounding technique can be implemented in MOSFET design and fabrication to increase the effective channel length of the MOSFET and to consequently reduce the leakage current and static power consumption associated with the MOSFET. In accordance with the gate-rounding technique, one or more segments of poly-silicon (or other material employed for constructing the gate region) can be deposited along with the gate region in a traditional MOSFET ("main gate region"). The one or more segments that are deposited along with the main gate region are herein referred to as "gate tips." During fabrication, the junction between the main gate region and each of the gate tips takes on a rounded shape ("gate-rounded regions"). The gate-rounded regions add to the average length of the gate region of the MOSFET thus increasing the effective channel length associated with the MOSFET. An increase in the effective channel length associated with the MOSFET causes a decrease in the leakage current and static power consumption of the MOSFET. Employing the gate-rounding technique to increase the effective channel length of the MOSFET can lower the cost and area associated with designing and fabricating the MOSFET. The gate-rounding technique implements the gate tips within voids (or empty spaces) in the design layout of the integrated circuit, thus ensuring that amount of area utilized by the design layout does not increase.

FIG. 1A is an example conceptual diagram (top-view) of a MOSFET 100 that employs the gate-rounding process to minimize leakage current. The MOSFET 100 comprises a substrate region 102 and a gate region (represented by the segments 104, 108, 110, 112, and 114 as will be described below). In FIG. 1A, slanted hatches are used to represent the gate region. The substrate region 102 comprises a source region 118 and a drain region 120. The source region 118 and the drain region 120 are both oppositely doped regions as compared to the substrate region 102. In one example of an N-channel MOSFET, the source region 118 and the drain region 120 can be N-doped semiconductor regions (e.g., N-doped silicon) on a P-doped semiconductor substrate (e.g., P-doped silicon). The gate region is deposited above the semiconductor substrate layer 102. The gate region is separated from the substrate region 102 by a gate oxide layer (typically silicon dioxide, not shown). Poly-silicon or another suitable material may be utilized to create the gate region on the gate oxide layer that lies on the substrate region 102. Typically, the source region 118 and the drain region 120 are on either side of the gate region as depicted in FIG. 1A. When a voltage is applied across the gate region and the source region 118 (or across the gate region and the drain region 120) of the MOSFET 100, a channel is created through the substrate region 102 from the source region 118 to the drain region 120. The channel length is the separation width between the source region 118 and the drain region 120 and is typically equal to the length of the gate region. With reference to FIG. 1A, MOSFETs are currently fabricated so that the gate region of the MOSFET comprises only the "main gate region" 104. Accordingly, the channel length (designated as L 106 in FIG. 1A) of MOSFETs that are fabricated with the current techniques is typically the width of the main gate region 104.

In some embodiments, in accordance with the gate-rounding process, additional poly-silicon material ("gate tips") can be deposited along with the main gate region 104. As depicted in FIG. 1A, gate tip 108 is deposited at the left side of one end of the main gate region 104 and gate tip 110 is deposited at the right side of the same end of main gate region 104. The main gate region 104 and the gate tips 108 and 110 together form a T-shaped gate region. As will be described further below, the gate tips 108 and 110 can be deposited so that there is a separation/gap between the gate tip and the substrate region 102. However, because of the sub-micron size of the MOSFET and imperfections in the fabrication process (e.g., photolithographic process), the junction between the main gate region 104 and each of the gate tips 108 and 110 may not have rectangular edges. In other words, the junctions between the main gate region 104 and each of the gate tips 108 and 110 may not be at 90 degrees to each other but may be rounded as depicted in FIG. 1A. This process by which the junctions between the main gate region 104 and each of the gate tips 108 and 110 are rounded is referred to herein as "gate-rounding." In FIG. 1A, gate-rounded region 112 (depicted by dashed lines) is formed at the junction of the gate tip 108 and the main gate region 104. Likewise, gate-rounded region 114 (depicted by dashed lines) is formed at the junction of the gate tip 110 and the main gate region 104. Thus, after fabrication using gate rounding, the effective gate region of the MOSFET comprises the main gate region 104, the gate tips 108 and 110, and the gate-rounded regions 112 and 114. As depicted in FIG. 1A, the gate-rounded regions 112 and 114 increase the effective length of the channel between the source region 118 and the drain region 120 by encroaching upon or covering portions of the substrate region 102 and consequently by increasing the length of the gate region near the junction between the main gate region 104 and the gate tips 108 and 110. Because the gate-rounded regions 112 and 114 cover some portions of the substrate region 102, the length of the gate region in these covered portions increases, while the length of the gate region in the other portions (not covered by the gate-rounded regions 112 and 114) remains the same. Accordingly, because of the increase in the gate length in the covered portions, the effective length of the gate region increases. The effective length of the gate region can be calculated as the average length of the gate region. In one implementation, the effective length of the gate region can be calculated as an average of the length of the gate region in the portions that are covered by the gate-rounded regions 112 and 114 (i.e., where the gate length has increased) and the length of the gate region in the other portions that are not covered by the gate-rounded regions 112 and 114 (i.e., where the gate length has not increased).

The maximum effective channel length is denoted in FIG. 1A as $L_{\mathit{eff\_max}}$ 116 and can be the longest part of the gate region (after gate rounding) that is above the substrate region 102. In other words, with reference to the top-view of the MOSFET 100 in FIG. 1A, the maximum effective channel length 116 can be the approximate distance between A) the top-view (visual) intersection point of the gate-rounded region 112 and the substrate region 102 and B) the top-view (visual) intersection point of the gate-rounded region 114 and the substrate region 102.

It should be noted that FIG. 1A depicts the gate region of the MOSFET 100 being divided into multiple segments (i.e., the main gate region 104, the gate tips 108 and 110, and the gate-rounded regions 112 and 114) for simplicity and ease of description. In practice, the gate region of the MOSFET 100 is constructed as a single region. Thus, the main gate region 104 and the gate tips 108 and 110 can be implanted on the gate oxide layer on the substrate region 102 as a single region. The gate-rounded regions 112 and 114 can be formed during the photolithographic process as described herein.

FIG. 1B is an example conceptual diagram of a MOSFET 150 including gate-rounding parameters that influence effective channel length of the MOSFET. FIG. 1B depicts the MOSFET 150 comprising the substrate region 102 and a gate region (represented by the regions 104, 110, and 114). The MOSFET 150 of FIG. 1B comprises a single gate tip 110 deposited at the right side of one end of the main gate region 104. Consequently, as described above with reference to FIG. 1A, after fabrication, the junction between the gate tip 110 and the main gate region 104 is rounded to form the gate-rounded region 114 (not shown in FIG. 1B). Thus, in FIG. 1B, the effective gate region comprises the main gate region 104, the gate tip 110, and the gate-rounded region 114. FIG. 1B also illustrates the gate-rounding parameters that can influence the effective channel length of the MOSFET. The gate-rounding parameters are A) the distance (L2) 152 between the gate tip 110 and the substrate region 102 and B) the length (R) 154 of the gate tip 110.

The distance 152 between the gate tip 110 and the substrate region 102 and the length 154 of the gate tip may be customizable and may be dependent on the fabrication process, geometric layout constraints, minimum feature size, design rules, and other such constraints. In some implementations, the distance 152 between the gate tip and the substrate region and the length 154 of the gate tip can be determined based on simulations and other data analysis. In some implementations, the distance 152 between the gate tip and the substrate region and the length 154 of the gate tip may vary depending on the layout of the integrated circuit on which the MOSFET will be implemented. In other implementations, the distance 152 between the gate tip and the substrate region and the length 154 of the gate tip may remain constant across multiple integrated circuit layouts. Typically, because of inherent process/physical variations, the gate tip can have an approximately predetermined length 154 and may be formed at substantially a predetermined distance 152 from the substrate region 102. For example, the predetermined distance 152 between the gate tip and the substrate region may be 40 nm. In some implementations, after fabrication, the distance between the gate tip and the substrate region may vary from 0% to 5% of the predetermined distance (e.g., 40 nm). In other implementations, after fabrication, the distance between the gate tip and the substrate region may vary from 5% to 10% of the predetermined distance. As another example, the predetermined length 154 of the gate tip may be 60 nm. In some implementations, after fabrication, the length of the gate tip may vary from 0% to 5% of the predetermined length (e.g., 60 nm). It is noted that the gate-rounded regions 112 and 114 may not encompass the entire gap between the corresponding gate tip and the substrate region 102. In other words, although the gate tips can be originally deposited at substantially the distance 152 from the substrate region 102, after the gate rounded regions are formed at the junctions of the main gate region and the gate tips, part of the distance 152 between the gate tip and the substrate region 102 can be covered by the corresponding gate-rounded region. However, the end of the gate tip or generally the overall gate tip remains at approximately the distance 152 from the substrate region 102.

As will be further described in FIGS. 2A-2C, the distance 152 between the gate tip and the substrate region, and the length 154 of the gate tip can be varied to modify the effective channel length associated with the MOSFET.

It is noted that although FIG. 1 depicts the MOSFET 100 comprising two gate tips 108 and 110 and corresponding two gate-rounded regions 112 and 114, embodiments are not so limited. In some embodiments, the MOSFET can comprise any suitable number of gate tips. For example, the MOSFET 150 can comprise one gate tip deposited at the right (or left) side of one end of the main gate region to form an inverted L-shaped gate region, as depicted in FIG. 1B. As another example, the two gate tips can be deposited at the left and the right sides of one end of the main gate region to form an inverted T-shaped gate region. As another example, a first gate tip and a second gate tip can be respectively deposited at a first end and a second end of the main gate region. As another example, three gate tips can be deposited along with the main gate region 104, as depicted in the MOSFET layout 160 of FIG. 1C. In FIG. 1C, the gate tips 108 and 110 are deposited at the left and right sides of one end of the main gate region 104 (as described with reference to FIG. 1A). Additionally, a third gate tip 162 is deposited at the left side of the other end of the main gate region 104. Thus, in the MOSFET layout 160, the effective gate region comprises the main gate region 104, the gate tips 108, 110, and 162, and the gate-rounded regions (not shown) between the main gate region and each of the gate tips. As another example, four gate tips can be deposited along with the main gate region 104, as depicted by the MOSFET layout 170 of FIG. 1D. In FIG. 1D, the gate tips 108 and 110 are deposited at the left and right sides of one end of the main gate region 104 (as described with reference to FIG. 1A) and the third gate tip 162 is deposited at the left side of the other end of the main gate region (as depicted in FIG. 1C). Additionally, a fourth gate tip 164 is deposited at the right side of that end of the main gate region 104. Thus, in the MOSFET layout 170, the effective gate region comprises the main gate region 104, the gate tips 108, 110, 162, and 164 and corresponding gate-rounded regions (not shown). As another example, other suitable number of gate tips can be deposited at the left and/or right sides (e.g., at one end, at both ends, along the length) of the main gate region 104 depending on the available space on the integrated circuit chip (e.g., the voids between the main gate region 104 and other components of the integrated circuit).

FIG. 2A is an example graph illustrating the relationship between the effective channel length associated with the MOSFET and the length of the gate tip. The Y-axis represents the effective channel length in micrometers (μm) while the X-axis represents the length (R) 154 of the gate tip. As depicted by FIG. 2A, the effective channel length has a direct relationship with the length 154 of the gate tip. In determining the relationship between the effective channel length and the length 154 of the gate tip, the distance (L2) 152 between the gate tip and the substrate region and the width of the substrate region 102 are assumed to be constant. Accordingly, as depicted in FIG. 2A, the effective channel length increases as the length 154 of the gate tip increases. This is because as the length 154 of the gate tip increases, the arc length of the gate-rounded region (at the junction of the gate tip and the main gate region) increases, and a larger portion of the gate-rounded region encroaches upon or covers the substrate region. This, in turn, increases the length of the gate region near the junction between the main gate region and the gate tip, increases the effective separation between the source region and the drain region, and increases the effective channel length of the MOSFET. As will be described with reference to FIG. 2C, an increase in the effective channel length causes a decrease in the leakage current generated by the MOSFET. In some implementations, the length 154 of the gate tip can depend on the design layout of the integrated circuit that comprises the MOSFET. In other words, the length 154 of the gate tip can be as large (or as small) as the void between components in the design layout so that the gate tip lies within the corresponding void.

FIG. 2B is an example graph illustrating the relationship between the effective channel length associated with the MOSFET and the distance between the gate tip and the substrate region. The Y-axis represents the effective channel length in micrometers (μm) while the X-axis represents the distance 152 between the gate tip and the substrate region. As depicted by FIG. 2B, the effective channel length has an inverse relationship with the distance (L2) 152 between the gate tip and the substrate region. In determining the relationship between the effective channel length and the distance L2 152, the length 154 of the gate tip and the width of the substrate region 102 are assumed to be constant. Accordingly as depicted in FIG. 2B, the effective channel length increases as the distance L2 152 decreases. This is because as the distance 154 between the gate tip and the substrate region decreases, a larger portion of the gate-rounded region (at the junction of the gate tip and the main gate region) encroaches upon or covers the substrate region. This, in turn, increases the length of the gate region near the junction between the main gate region and the gate tip, increases the effective separation between the source region and the drain region, and increases the effective channel length of the MOSFET. As will be described with reference to FIG. 2C, an increase in the effective channel length causes a decrease in the leakage current generated by the MOSFET. In some implementations, the distance 152 between the gate tip and the substrate region may be selected to be within the range of 40 nm to 50 nm. In some implementations, the distance 152 between the gate tip and the substrate region may be selected depending on the fabrication process, geometric layout constraints, etc. For example, if the minimum feature size is 40 nm, the distance 152 between the gate tip and the substrate region may typically not be less than 40 nm (however, some variations are possible due to the fabrication process, as described above).

FIG. 2C is an example graph illustrating the relationship between the effective channel length associated with the MOSFET and the leakage current generated by the MOSFET. The Y-axis represents the percentage decrease in the leakage current generated by the MOSFET while the X-axis represents the effective channel length in nanometers (nm). As depicted by FIG. 2C, the leakage current generated by the MOSFET decreases exponentially as the effective channel length associated with the MOSFET increases. In some implementations, based on the graph of FIG. 2C, the length 154 of the gate tip and the distance 152 between the gate tip and the substrate region may be varied so that effective channel length is approximately equal to or greater than 45 nm. In some implementations, the effective channel length that may be needed to achieve a certain reduction in leakage current may vary depending on the fabrication process that is implemented.

FIG. 3 is a top view of an example inverter layout 300 using MOSFETs fabricated using the gate-rounding process. The inverter layout 300 depicts a complementary MOSFET (CMOS) inverter comprising a P-channel MOSFET (PMOS) 302 and an N-channel MOSFET (NMOS) 304. The inverter layout 300 also depicts a power supply rail 306 and a ground terminal (or reference power supply rail) 340. The PMOS 302 comprises a substrate region, a main gate region 312, and gate tips 314 and 316 deposited at one end of the main gate region 312. The substrate region of the PMOS 302 comprises a source region 346 and a drain region 348. The source region 346 and the drain region 348 are separated by the main gate region 312. Likewise, the NMOS 304 comprises a substrate region, a main gate region 330, and gate tips 336 and 338 deposited at one end of the main gate region 330. The substrate region of the NMOS 304 comprises a source region 342 and a drain region 344. The source region 342 and the drain region 344 are separated by the main gate region 330. In the inverter layout 300, the PMOS 302 and the NMOS 304 are connected together in a common gate, common drain configuration. Therefore, as depicted in FIG. 3, the main gate region 312 of the PMOS 302 is coupled with the main gate region 330 of the NMOS 304. Furthermore, gate tips 320 and 322 are also deposited at a suitable intermediate position along the length of the coupled main gate region. For example, the gate tips 320 and 322 can be deposited at or near the intersection of the main gate regions 312 and 330. Common gate terminal 324 is on the gate tip 320. An input signal can be provided to the inverter via the common gate terminal 324. It is noted that in other implementations of the inverter layout 300, any suitable number of gate tips can be deposited at the left/right sides of the main gate region. Moreover, the common gate terminal can be placed at any position on the main gate regions or on the gate tips.

The source region 346 of the PMOS 302 is coupled with the power supply rail 306 via a metal coupling 308 and the junction 310 between the source region 346 and the metal coupling 308 is designated as the source terminal 310 of the PMOS 302. The drain region 348 of the PMOS 302 is coupled with the drain region 344 of the NMOS 304 via a metal coupling 326. The junction 318 between the drain region 348 of the PMOS 302 and the metal coupling 326 is designated as the drain terminal 318 of the PMOS 302. The junction 328 between the drain region 344 of the NMOS 304 and the metal coupling 326 is designated as the drain terminal 328 of the NMOS 304. An output signal (i.e., the inverse of the input signal provided at the gate terminal 324) can be received at the drain terminal 318, the drain terminal 328, or another suitable terminal along the metal coupling 326. The source region 342 of the NMOS 304 is coupled with the ground terminal 340 via a metal coupling 334 and the junction 332 between the source region 342 and the metal coupling 334 is designated as the source terminal 332 of the NMOS 304. Although not depicted in FIG. 3, it is noted that after fabrication, the junctions between the main gate region and each of the gate tips 314, 316, 320, 322, 336, and 338 will typically not be rectangular but will instead be rounded, as depicted and described above with reference to FIG. 1A, due to the gate rounding effect described herein. After fabrication, the effective gate region associated with the MOSFET inverter can then comprise the main gate regions 312 and 330, the gate tips 314, 316, 320, 322, 336, and 338, and the gate-rounded regions between the main gate regions and each of the gate tips.

Figure 4:
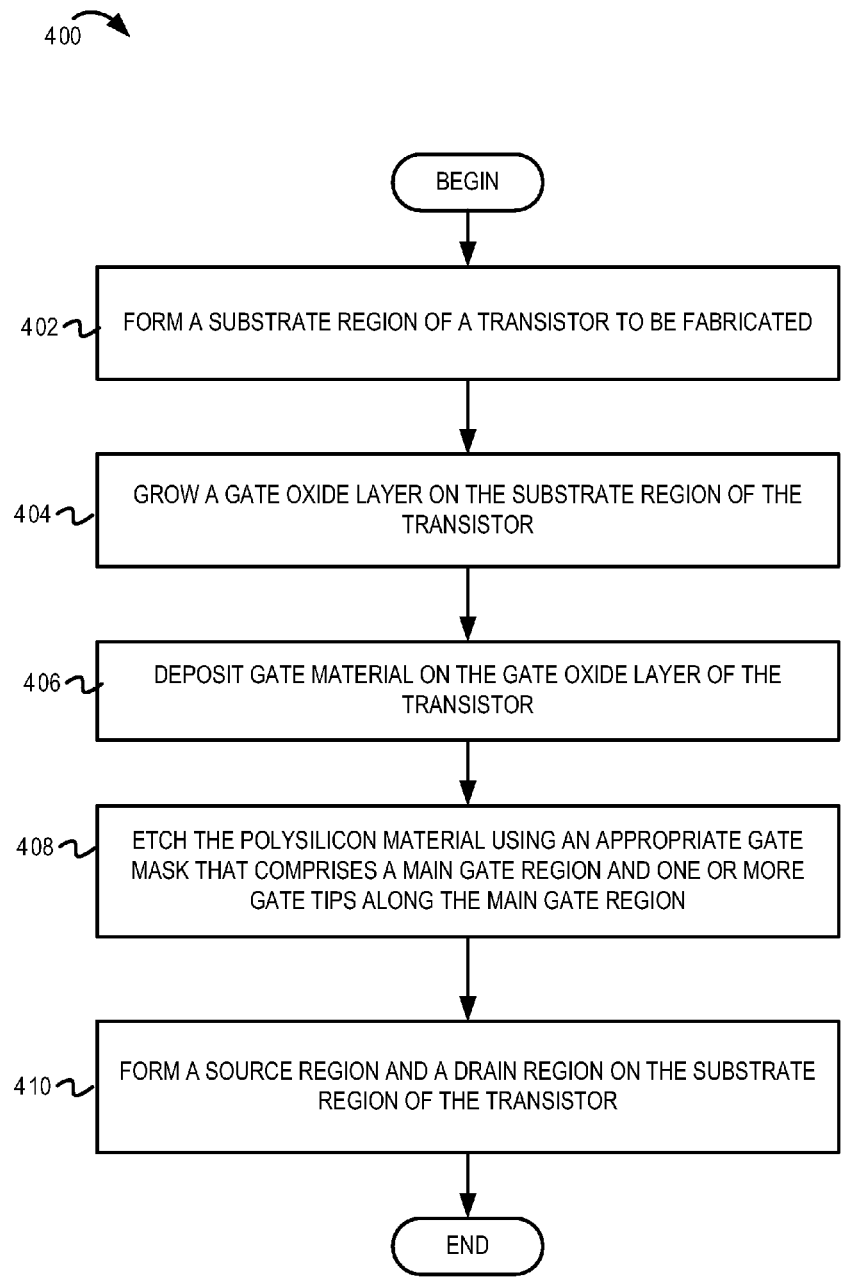
FIG. 4 is a flow diagram illustrating example transistor fabrication operations including a gate-rounding process.

FIG. 4 is a flow diagram ("flow") 400 illustrating example transistor fabrication operations including a gate-rounding process. The flow 400 begins at block 402.

At block 402, a substrate region of the transistor to be fabricated is formed. In one implementation, a fabrication system can form the substrate region of the transistor. For example, to fabricate a MOSFET 100, the substrate region 102 can be formed using an ion implanting process, an ion diffusion process, or another suitable process. For an N-channel MOSFET, the substrate region 102 can be a p-doped semiconductor (e.g., p-doped silicon). For a P-channel MOSFET, the substrate region 102 can be a n-doped semiconductor. It is noted that in other implementations, the transistors can be junction FETs (JFETs) or other suitable transistors. The flow continues at block 404.

At block 404, a gate oxide layer is grown on the substrate region of the transistor. For example, the fabrication can grow a layer of field oxide (e.g., silicon dioxide) over the substrate region 102 using a thermal oxidation process. Next, the field oxide layer can be etched (e.g., using a hydrogen fluoride (HF) etching process or a photo-etching process) to reveal a portion of the substrate region 102 on which the MOSFET will be formed. A first mask can be employed to etch the field oxide from only those portions of the substrate region 102 on which the MOSFET (i.e., a source region a, a drain region, and a gate region). Next, a gate oxide layer can be grown (e.g., using the thermal oxidation process). Typically, the gate oxide layer can also be the same material as the field oxide layer (e.g., silicon dioxide). However, the thickness of the gate oxide layer is typically much smaller than the thickness of the field oxide layer. The flow continues at block 406.

At block 406, gate material is deposited on the gate oxide layer of the transistor. For example, the fabrication system can deposit polycrystalline silicon (also referred to as polysilicon), aluminum, or another suitable gate material on the gate oxide layer using chemical vapor deposition (CVD) or another suitable deposition mechanism. The gate material can be deposited across the gate oxide layer that covers the entire substrate region. A gate mask can then be used (as will be described below) to form the gate region and to remove the gate oxide and the gate material from the other portions of the substrate region. The flow continues at block 408.

At block 408, the gate region is formed by etching the gate material using an appropriate gate mask that comprises a main gate region and one or more gate tips along the main gate region. For example, the fabrication system can etch the polysilicon and the corresponding gate oxide layer using the gate mask to form the gate region. In other words, the gate mask can protect those areas of the polysilicon that should not be etched (or removed). These areas of the polysilicon that remain on the substrate region (i.e., the areas of the polysilicon and gate oxide that are not removed) constitute the gate region of the transistor. In some implementations, the gate mask can be constructed to etch the polysilicon and gate oxide from those areas on the substrate region 102 on which the source region and the drain region will be formed. In some implementations, the gate mask can be constructed such that it does not remove the gate oxide (or the field oxide from those portions of the substrate region 102 on which the MOSFET will not be formed). The gate mask can also be constructed by identifying (e.g., prior to the fabrication process) one or more voids (or gaps or empty spaces) between components, interconnections, etc. in a design layout of an integrated circuit that comprise the transistor. In some implementations, a main gate region of the transistor can be identified on the design layout and one or more voids in the design layout that are proximate to (or contiguous) to the main gate region can be identified. The gate mask can be designed accordingly to form the main gate region and the gate tips, so that the gate tips lie within corresponding voids.

In some implementations, the polysilicon (and the gate oxide layer) can be etched in accordance with the gate mask so that the gate tip and the main gate region are at right angles (90 degrees) to each other. It should be understood that due to process limitations and physical limitations, the main gate region 104 may be substantially perpendicular to the substrate region 102. Also, due to process/physical limitations the gate tips 108 and 110 may be substantially parallel to the substrate region and may be substantially perpendicular to the main gate region 104. For example, the gate tips 108 and 110 may not be perfectly parallel to the substrate region 102 but may have a 0%-5% deviation from the perfectly parallel position. In other implementations, the gate tip and the main gate region can have other suitable angles at their junction. Thus, although the gate tip can be generally parallel to the substrate region 102, a particular point (or section) of the gate tip such as the junction between the gate tip and the main gate region 104 may not be parallel to the substrate region 102.

Any suitable number of gate tips can be etched along with the main gate region. For example, two gate tips (as depicted in FIG. 1A), one gate tip (as depicted in FIG. 1B), three gate tips (as depicted in FIG. 1C), or four gate tips (as depicted in FIG. 1D) can be etched at the left/right sides of the main gate region. In some implementations, only a predetermined number of gate tips can be etched along with the main gate region, irrespective of the number of voids identified during a pre-fabrication analysis. In other implementations, the number of gate tips may be limited only by the number of voids identified during the pre-fabrication analysis. The length 154 of the gate tips and the distance 152 between the gate tips and the substrate region can influence the effective channel length associated with the transistor, as described above in FIGS. 2A-2C. In some implementations, all the gate tips may have the same length and may be at the same distance from the substrate region. In other implementations, some/all of the gate tips may have different lengths and/or different distances from the substrate region.

Due to process limitations and physical limitations of the fabrication process, the junction between each gate tip and the main gate region may change from a substantially rectangular junction to a substantially rounded junction, as described above. For example, the junction may change to the substantially rounded region after heat is applied to the transistor during the fabrication process or during other steps of the fabrication process. The rounded junction between the gate tip and the traditional gate region is referred to herein as the gate-rounded region. As described above, because of the gate-rounding process, at least a portion of the gate-rounded region encroaches on to or covers the substrate region increasing the length of the gate region near the junction between the main gate region and each of the gate tips, and therefore increasing the effective channel length associated with the transistor. An increase in the effective channel length results in a decrease in the leakage current generated by, and the static power consumption associated with, the transistor. The flow continues at block 410.

At block 410, a source region and a drain region are formed on the substrate region of the transistor. For example, the fabrication system can form the source region 118 and the drain region 120 on the substrate region 102 by doping the etched portions of the substrate region 102 accordingly. The fabrication system can use an impurity diffusion process, an ion implantation process, or another suitable process to form the source region and the drain region on the substrate region 102 of the transistor. For example, for an N-channel MOSFET, the substrate region 102 can be a p-doped semiconductor and the source region 118 and the drain region 120 can be formed by implanting impurities to form an n-doped source region and an n-doped drain region on the p-doped substrate region. It is noted that after the source region, the drain region, and the gate region are formed on the substrate region, the transistor fabrication process can comprise one or more additional steps. For example, the entire surface of the substrate region 102 can be covered with an insulating layer of silicon dioxide. Finally, metal contacts are formed on the source region, the drain region, and the gate region. Metal interconnects are added to connect the transistor to one or more other components of the integrated circuit. From block 408, the flow ends.

It should be understood that FIGS. 1A-4 are examples meant to aid in understanding embodiments and should not be used to limit embodiments or limit scope of the claims. Embodiments may perform additional operations, fewer operations, operations in a different order, operations in parallel, and some operations differently. It is noted that the gate-rounding technique described herein can be applied to pre-existing design layouts. The gate-rounding technique can also be applied as an extension to existing techniques (e.g., the high-threshold MOSFET design, the long-channel MOSFET design, etc.) for reducing the leakage current generated by the MOSFET to further reduce the leakage current generated by and static power consumption associated with the MOSFET. In some implementations, the gate-rounding technique for MOSFET design can be employed in various types of circuits, such as, but not limited to, standard logic, driver, memory cells, and other integrated circuits that employ MOSFETs. Additionally, it is noted that in other embodiments the order in which some of the operations are performed for transistor fabrication can be different from the order depicted in FIG. 4.

While the embodiments are described with reference to various implementations and exploitations, it will be understood that these embodiments are illustrative and that the scope of the inventive subject matter is not limited to them. In general, gate rounding techniques for reduced transistor leakage current as described herein may be implemented with facilities consistent with any hardware system or hardware systems. Many variations, modifications, additions, and improvements are possible.

Plural instances may be provided for components, operations, or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

The invention claimed is:

1. A transistor comprising:
a substrate region including a source region and a drain region; and
a gate region including,
a main gate portion formed over a portion of the substrate region between the source region and the drain region; and
a first gate tip formed at a first end of the main gate portion that extends beyond, without overlapping, the portion of the substrate region between the source region and the drain region, the first gate tip joined with the first end at a junction and extending transversely from the first end, and wherein a rounded gate portion is formed at the junction between the first gate tip and the main gate portion.

2. The transistor of claim 1, wherein the gate region is a polysilicon gate region comprising a polysilicon main gate portion, one or more polysilicon gate tips, and one or more corresponding polysilicon rounded gate portions.

3. The transistor of claim 1, wherein the main gate portion further includes a second end that extends beyond the portion of the substrate region between the source region and the drain region in the opposite direction as the first end, said transistor further comprising:
a second gate tip formed at the second end, wherein the second gate tip is formed at the second end at a junction and extends transversely from the second end, and wherein a rounded gate portion is formed at the junction between the second gate tip and the main gate portion.

4. The transistor of claim 1, wherein the first gate tip is substantially parallel to the portion of the substrate region between the source region and the drain region.

5. The transistor of claim 1, wherein the first end is formed substantially perpendicular to the portion of the substrate region between the source region and the drain region, and wherein the first gate tip is substantially parallel to the portion of the substrate region between the source region and the drain region.

6. The transistor of claim 1, further comprising a gate oxide portion formed between the substrate region and the gate region.

7. The transistor of claim 1, wherein the main gate portion further includes a second end that extends beyond the portion of the substrate region between the source region and the drain region in the opposite direction as the first end, said transistor further comprising:
a second gate tip formed at the first end and extending transversely from the first end in the opposite direction as the first gate tip; and
a third gate tip formed at the second end, wherein the third gate tip extends transversely from the second end.

8. The transistor of claim 1, wherein the main gate portion further includes a second end that extends beyond the portion of the substrate region between the source region and the drain region in the opposite direction as the first end, said transistor further comprising:
a second gate tip formed at the first end and extending transversely from the first end in the opposite direction as the first gate tip;
a third gate tip formed at the second end and extending transversely from the second end; and
a fourth gate tip formed at the second end and extending transversely from the second end in the opposite direction as the third gate tip.

9. The transistor of claim 1, wherein the rounded gate portion between the first gate tip and the main gate portion extends across a sub-portion of the portion of the substrate region between the source region and the drain region.

10. The transistor of claim 9, wherein an effective channel length associated with the transistor is an average gate length associated with the transistor, wherein the average gate length is determined based, at least in part, on a first gate length associated with a first portion of the substrate region that is covered by the rounded gate portion and a second gate length associated with a second portion of the substrate region that is not covered by the rounded gate portion.

11. The transistor of claim 1, wherein for the first gate tip, an increase in a length of the first gate tip increases an effective channel length of the transistor, and a decrease in a distance between the first gate tip and the substrate region increases the effective channel length of the transistor.

12. The transistor of claim 1, wherein the transistor is a metal oxide semiconductor field effect transistor (MOSFET).

13. A metal oxide semiconductor field effect transistor (MOSFET) comprising:
a substrate region including a source region and a drain region; and
a gate region including,
a main gate portion formed over a portion of the substrate region between the source region and the drain region and including a first end and a second end that each extend beyond and do not overlap the portion of the substrate region between the source regions and the drain region; and
at least one gate tip formed at the first end and the second end, wherein each of the at least one gate tip extends transversely from the first or second end and is formed at a distance from the portion of the substrate region between the source region and the drain region, and wherein for each of the at least one gate tip, a corresponding rounded gate portion is formed at a junction between the at least one gate tip and the main gate portion.

14. The MOSFET of claim 13, wherein the main gate portion is formed substantially perpendicular to the portion of the substrate region between the source region and the drain region, and wherein each of the at least one gate tip is formed at one of the first end and the second end and is substantially parallel to the portion of the substrate region between the source region and the drain region.

15. The MOSFET of claim 13, wherein the gate region includes a plurality of gate tips, wherein at least one of the plurality of gate tips has a different length and a different distance from the portion of the substrate region between the source region and the drain region compared to at least one other of the plurality of gate tips.

16. The MOSFET of claim 13, wherein
the at least one gate tip comprises a first gate tip, a second gate tip, and a third gate tip, wherein the first gate tip and the second gate tip are formed at the first end and the third gate tip is formed at the second end, or
the at least one gate tip comprises the first gate tip, the second gate tip, the third gate tip, and a fourth gate tip, wherein the first gate tip and the second gate tip are formed at the first end and the third gate tip and the fourth gate tip are formed at the second end.

17. An integrated circuit comprising a plurality of transistors, each of the plurality of transistors comprising:
a substrate region including a source region and a drain region; and
a gate region including,
a main gate portion formed over a portion of the substrate region between the source region and the drain region and including a first end that extends beyond, without overlapping, the portion of the substrate region between the source region and the drain region; and
a first gate tip formed at the first end, the first gate tip joined with the first end at a junction and extending transversely from the first end, and wherein a rounded gate portion is formed at the junction between the first gate tip and the main gate portion.

18. The integrated circuit of claim 17, wherein for each transistor, the main gate portion further includes a second end that extends beyond the portion of the substrate region between the source region and the drain region in the opposite direction as the first end, said transistor further comprising:
a second gate tip formed at the second end, wherein the second gate tip joins with the second end at a junction and extends transversely from the second end, and wherein a rounded gate portion is formed at the junction between the second gate tip and the main gate portion.

19. The integrated circuit of claim 18, wherein the first and second gate tips are formed within a corresponding void between components in a design layout of the integrated circuit.

20. The integrated circuit of claim 19, wherein a length of each of the first and second gate tips is determined based, at least in part, on a length of the corresponding void within which the gate tip is formed.

* * * * *